(12) United States Patent
Vester (10) Patent No.: US 8,415,951 B2
(45) Date of Patent: *Apr. 9, 2013

(54) UPCONVERTER

(75) Inventor: Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 444 days.

This patent is subject to a terminal disclaimer.

(21) Appl. No.: 12/726,567

(22) Filed: Mar. 18, 2010

(65) Prior Publication Data

US 2010/0253345 A1   Oct. 7, 2010

(30) Foreign Application Priority Data

Apr. 3, 2009 (GB) .................................... 0905755.5
Sep. 8, 2009 (GB) .................................... 0915655.5

(51) Int. Cl.
*G01V 3/00* (2006.01)
*G01R 33/20* (2006.01)

(52) U.S. Cl. ......... 324/316; 324/318; 324/322; 330/165

(58) Field of Classification Search .......... 324/300–322; 330/79–165
See application file for complete search history.

(56) References Cited

U.S. PATENT DOCUMENTS

| | | | |
|---|---|---|---|
| 3,611,110 A | 10/1971 | Corbey | |
| 3,824,482 A | 7/1974 | Whelehan, Jr. | |
| 4,387,470 A | 6/1983 | Maurer et al. | |
| 5,245,288 A | 9/1993 | Leussler | |
| 5,384,536 A | 1/1995 | Murakami et al. | |
| 6,906,520 B2 | 6/2005 | Heid et al. | |
| 7,123,009 B1 | 10/2006 | Scott | |
| 7,123,090 B2 | 10/2006 | Ratzel | |
| 7,323,876 B2 | 1/2008 | Den Boef | |
| 7,417,433 B2 | 8/2008 | Heid et al. | |
| 7,622,928 B2 | 11/2009 | Gauss et al. | |
| 7,701,220 B2 | 4/2010 | Ehnholm | |
| 7,750,630 B2 | 7/2010 | Van Helvoort et al. | |
| 7,750,635 B2 | 7/2010 | Van Helvoort et al. | |
| 7,777,492 B2 | 8/2010 | Vernickel et al. | |
| 2003/0206019 A1 | 11/2003 | Boskamp | |
| 2007/0013376 A1 | 1/2007 | Heid et al. | |
| 2007/0176601 A1 | 8/2007 | Adachi | |
| 2007/0188175 A1 | 8/2007 | Burdick, Jr. et al. | |
| 2007/0207763 A1 | 9/2007 | Bollenbeck et al. | |
| 2008/0157769 A1 | 7/2008 | Renz et al. | |
| 2008/0246477 A1 | 10/2008 | Nakabayashi | |

(Continued)

FOREIGN PATENT DOCUMENTS

| | | |
|---|---|---|
| DE | 103 04 861 A1 | 8/2004 |
| GB | 1132545 | 1/1967 |

OTHER PUBLICATIONS

U.S. Appl. No. 12/874,706, filed Sep. 2, 2010.
U.S. Appl. No. 12/753,159, filed Apr. 2, 2010.
U.S. Appl. No. 12/753,132, filed Apr. 2, 2010.

(Continued)

*Primary Examiner* — Vincent Q Nguyen
*Assistant Examiner* — Emily Chan
(74) *Attorney, Agent, or Firm* — Schiff Hardin LLP (57) ABSTRACT

An upconverter has a two port parametric amplifier that has a first port to receive an input signal to be amplified and upconverted and a second port to receive a local oscillator signal and to output the amplified, upconverted signal at upper and lower sideband frequencies. The upconverter further has an antenna coupled to the second port and a power splitter inserted between the second port of the parametric amplifier and the antenna.

13 Claims, 6 Drawing Sheets

U.S. PATENT DOCUMENTS

2009/0079428 A1* 3/2009 Nistler et al. ............ 324/311
2009/0286478 A1 11/2009 Biber et al.
2010/0117650 A1* 5/2010 Cork et al. ............ 324/322

OTHER PUBLICATIONS

U.S. Appl. No. 12/753,150, filed Apr. 2, 2010.
U.S. Appl. No. 12/753,134, filed Apr. 2, 2010.
U.S. Appl. No. 12/753,148, filed Apr. 2, 2010.
U.S. Appl. No. 12/753,138, filed Apr. 2, 2010.
"Behavioral Modeling and Simulation of a Parametric Power Amplifier," Gray et al., IMS (2009) pp. 1373-1376.

* cited by examiner

FIG 8 ature resonance imaging (MRI) systems.
UPCONVERTER

BACKGROUND OF THE INVENTION

1. Field of the Invention

The present invention relates to an upconverter using a two port parametric amplifier, in particular for use in magnetic resonance imaging (MRI) systems.

2. Description of the Prior Art and Related Subject Matter

MRI scanners use a combination of a strong constant magnetic field ($B_0$) from a superconducting magnet which is modified by gradient fields generated by gradient coils, together with a rotating magnetic field ($B_1$) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the $B_1$ field and with the signals generated from the patient so 'traps' (high impedance sections) must be included at regular (typically λ/8) intervals. These add cost and inconvenience to the structure. In use, the requirement to connect the cables and sterilise them between scanning one patient and the next leads to down-time between scans. Elimination of these cables is therefore desirable.

In co-pending patent application no. 0903722.7, corresponding to U.S. Ser. No. 12/612,831 filed Nov. 5, 2009, a wireless MRI system is described in which an array of antennas lining the MRI scanner bore is arranged to transmit a local oscillator (LO) signal that is received by antennas on the patient mat and fed therefrom to upconverters which upconvert magnetic resonance signals received from local coils in the patient mat and re-radiate them from the same antenna to be received at one or more of the bore array antennas for downconversion and processing to generate an MRI image.

However, wireless implementations give rise to new problems. When using a two port parametric amplifier in a wireless implementation, it is desirable that the parametric amplifier is entirely powered by an incident local oscillator (LO) signal at a microwave frequency. When there is no incident LO signal, there is no DC bias voltage, so the capacitance of the varactor diodes in the parametric amplifier is high. This leads to the parametric amplifier output being tuned to a lower frequency than its nominal tuned frequency. The resulting low impedance presented to the local oscillator loads the signal and reduces the available LO voltage. Where the LO voltage is used to generate a bias voltage, then can result in the parametric amplifier being locked in a stable, non-functional, state. Although this can be dealt with by using a self start circuit, such circuits add complexity.

SUMMARY OF THE INVENTION

In accordance with a first aspect of the present invention, an upconverter has a two port parametric amplifier, the amplifier comprising a first port to receive an input signal to be amplified and upconverted and a second port to receive a local oscillator signal and to output the amplified, upconverted signal at upper and lower sideband frequencies, and the upconverter further has an antenna coupled to the second port; and a power splitter inserted between the second port of the parametric amplifier and the antenna.

A local oscillator signal received by the antenna is input to the power splitter and the power splitter then provides a portion of the received local oscillator signal to the second port. The power splitter ensures that sufficient LO power is available for the parametric amplifier to operate reliably and avoids the need for a self start circuit.

Preferably, the local oscillator signal has a frequency at least twice that of the input signal.

Preferably, a power harvester is inserted between an output of the power splitter and a DC bias input of the parametric amplifier.

Preferably, the power harvester includes a Cockcroft Walton multiplier.

Preferably, the power harvester includes an impedance circuit to increase the available RF voltage from the local oscillator prior to rectification to DC.

Preferably, the output of the power splitter, connected to the power harvester has a higher attenuation than an output of the power splitter connected to the parametric amplifier.

Connection of the power harvester to the higher attenuation port of the power splitter isolates changes in impedance with local oscillator strength at the parametric amplifier interface, from the source impedance of the rectifier.

Preferably, the power splitter has one of a directional coupler and a Wilkinson coupler.

Preferably, the two port parametric amplifier has a pair of varactor diodes connected between the first port and the second port; wherein the diodes are connected in parallel from the first port and in series from the second port.

Preferably, the first port is an RF port.

Preferably, the first port receives signals in the frequency range 20 MHz to 500 MHz.

Preferably, the second port is a microwave port.

Preferably, the second port receives signals in the frequency range 1 GHz to 5 GHz.

In accordance with a second aspect of the present invention, a wireless magnetic resonance imaging system has a local oscillator and transceiver array mounted on or downstream of a bore of the system; and a wireless local coil array and upconversion stage having a number of upconverters according to the first aspect.

DESCRIPTION OF THE PREFERRED EMBODIMENTS

The wireless concept to which the features of the present invention apply is based on upconversion, in the patient mat, of the RF (Larmor) frequency signals from the patient coils to microwave frequencies for transmission to microwave antennas located on the bore of the scanner. The combination of transmit and receive antennas on the patient and bore respectively constitutes a MIMO (Multiple Input/Multiple Output) system. The greater multiplicity of receive antennas in the bore array allows individual signals from a number of patient antennas to be resolved. The present invention relates to an implementation of the upconversion process.

Figure 1:
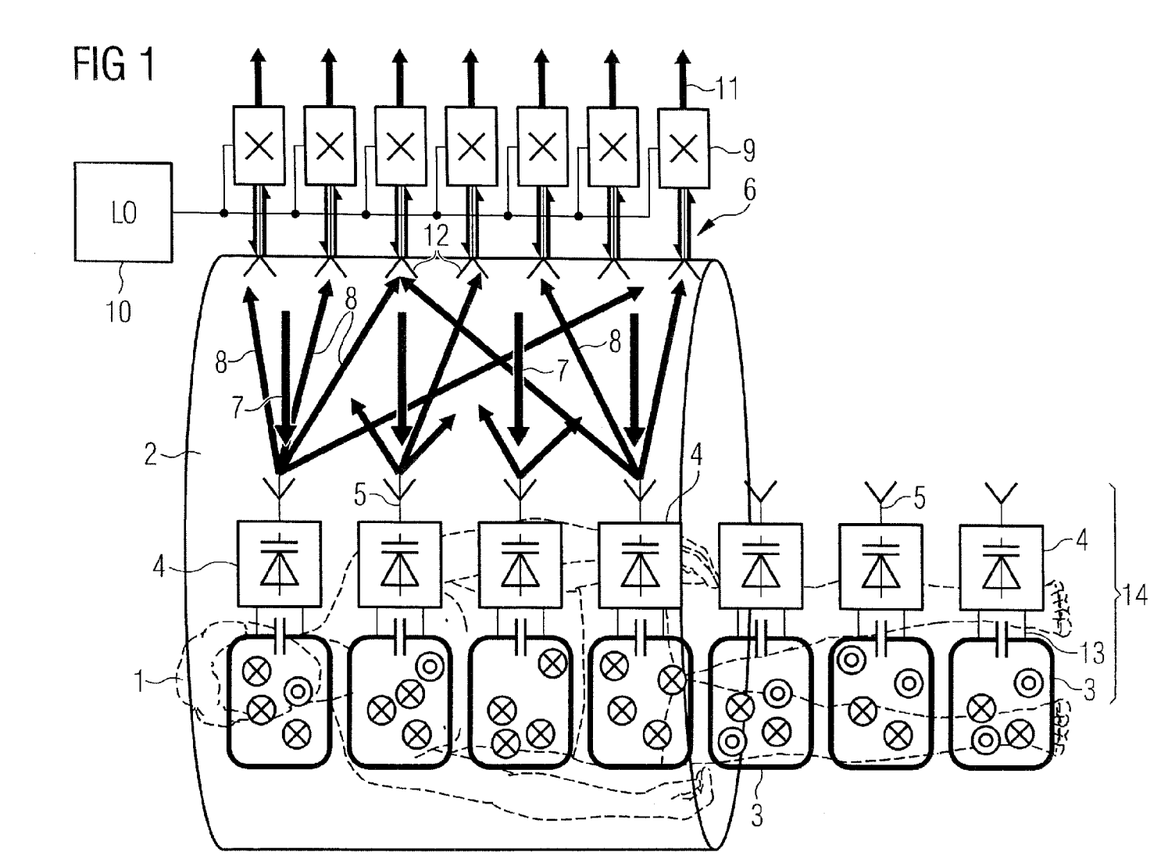
FIG. 1 illustrates an example of an MRI system incorporating upconverters according to the present invention.
Figure 2:
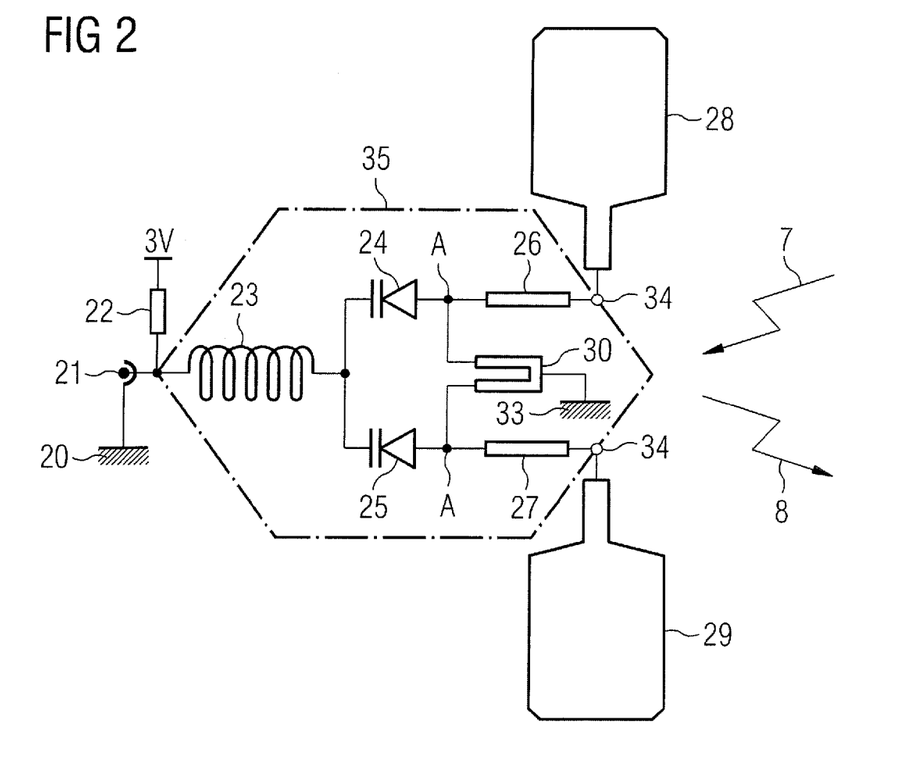
FIG. 2 illustrates in more detail, an example of a parametric amplifier for use in an upconverter in the system of FIG. 1.

An example of an MRI system using a MIMO microwave link, for example as described in more detail in the aforementioned co-pending UK patent application no. 0903722.7 corresponding to U.S. Ser. No. 12/612,831, is shown in FIGS. 1 and 2. FIG. 1 shows a patient 1 within an MRI scanner bore tube 2. A mat covers part of the patient for imaging and embedded in the mat are a plurality of local coils 3. Associated with each local coil 3 is an upconverter stage 4 and microwave antenna 5. Transceivers 9, connected to an array 6 of antennas 12, are integrated into the scanner bore 2. The frequency upconverter 4 for each patient mat coil 3 produces signals for transmission to the array of transceivers in the scanner bore 2. A local oscillator (LO) signal at around 2.4 GHz, or other chosen microwave frequency, feeds the antenna array 6 to illuminate the patient coil electronics 14 with a signal 7 at the local oscillator frequency. Parametric amplifiers in the upconverter stage 4 use the incident local oscillator signal 7 to provide a frequency reference and power for upconversion. Magnetic resonance (MR) signals 13 from the coils are thereby converted to microwave frequency signals 8 and transmitted to the bore transceiver antenna array 6. The same local oscillator signal in the transceivers converts the upconverted signals 8, received from the patient coils 3 at the LO frequency ±63 MHz, back to the original MR frequency of 63 MHz for input 11 to MR receivers in an image processing system (not shown.) The Larmor frequency $\omega_0$ is dependent upon the gyromagnetic ratio $\gamma$ and the magnetic field strength $B_0$, so in the case of a 1.5 Tesla magnet, the MR frequency is 63.6 MHz, or for a 3 T magnet, the MR frequency is 123 MHz. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

The present invention uses a parametric amplifier circuit to carry out the mixing and amplification necessary for upconversion 4 of a radio frequency signal 13 received from each of the local coils 3.

An example of the parametric amplifier is shown in more detail in FIG. 2. FIG. 2 comprises a parametric amplifier core 35 provided with a single ended RF input 21 to receive the MR signal 13 from the local coil. A bias voltage 22 and ground 20 are provided at the input and a microwave port 34 at the output is connected to dipole antennas 28, 29. In this example, the magnetic resonance signal is at 63.6 MHz. The RF signal 13 is fed via a high Q RF input inductor 23 to drive a varactor diode pair 24, 25 in common mode parallel with 'earth return' via a shunt matching line pair 30 to ground connection 33. A high impedance (very low current requirement) voltage source provides the bias voltage 22 at e.g. 3V, via the high Q RF input matching choke 23 to the varactor diode pair 24, 25 (e.g. BBY53-02V) to set the correct operational capacitance bias point. Incident local oscillator (LO) 'pump' signal 7 (at a frequency for example of 2.44 GHz) received by the microwave antenna 28, 29 is input to the microwave port and fed via the appropriate printed microwave series matching lines 26, 27 and shunt matching lines 30 to provide differential drive (with centre ground 33) to the varactor diode pair 24, 25. This differential LO signal 7 mixes with the common mode RF drive signal 13 in the varactor diodes 24, 25 to produce microwave frequency lower side band (LSB) and upper side band (USB) products. These differential mode mixing products are fed back through the microwave matching lines 26, 27 and microwave port 34 to the microwave antenna 28, 29 for transmission back to the bore array of transceivers.

The two varactor diodes 24, 25 of the parametric amplifier circuit serve as an upconverter and an amplifier that requires no DC power supply, using directly the 'pump' signal 7 as a local oscillator and source of power. Parametric amplifiers are typically two port devices where a first port receives an input signal at a relatively low frequency to be upconverted and amplified and a second port both receives the pump signal at a relatively high frequency and outputs the relatively high frequency upconverted and amplified mixing product. Circulators are commonly used to separate the upconverted output signals from the incident LO drive signals, but these ferromagnetic based devices are not suitable for MRI applications because of the B0 field. Instead, re-radiated LSB/USB signals are separated from the incident LO in filters in the bore transceivers.

For the example of the present invention, it is desirable that the pump signal 7 to the parametric amplifier core 35 should be received from an over-the-air transmission in order to remove any requirement for a DC power supply to the mat. The total bandwidth occupied by the upper and lower sidebands 8 and the pump signal 7 is typically small enough to fall within the efficient bandwidth of a single antenna. Thus, a two port parametric amplifier circuit is used, such that the first port 21 receives the input signal 13 to be upconverted and amplified and the second port 34 receives the pump signal 7 and also outputs the upconverted and amplified input signal 8 at the upper and lower sideband frequencies.

The local oscillator signal 7 received by the dipole antenna 28, 29 from the bore array transmitters 9 arrives at the microwave port 34 at a power level of +10 dBm. This 'pump' signal is fed via the printed line matching 26, 27 to the varactor diode pair 24, 25. The common cathode configuration of the varactor diodes, with the anodes connected one to each half of the balanced feed from the dipole antenna 28, 29, results in antiphase stimulation of the varactor diodes at the LO (pump) frequency. RF stimulation via the RF input inductor 23 at the common cathode node leads to in-phase stimulation of the varactor diodes 24, 25 at the RF frequency. The resulting LSB and USB signals generated in each of the two varactor diodes are therefore in anti-phase. These wanted output signals, along with the greater (reflected) part of the incident LO signal 7, are then conveyed via the printed line matching 26, 27 back to the microwave port 34 and the dipole antenna 28, 29 where the signals 8 are broadcast into the bore 2 for reception by the bore receiver array system 6, 9, 10.

The high Q RF input matching choke 23 in series with the single ended RF input 21 is series resonant with the high capacitive reactance of the varactor diodes 24, 25 at the RF frequency. The ground return for the RF feed 21 is provided by the center grounding 33 of the microwave port 34 shunt line. The centre-grounded shunt microstrip line resonates with the greater part of the high capacitive admittance of the varactor diodes 24, 25 at the microwave port frequency. The balanced pair of series lines 26, 27 then tunes out the remainder of the capacitive reactance of the varactor diodes and completes the impedance transformation to match to the 22Ω balanced load of the microwave dipole antenna 28, 29.

In this implementation of the present invention, the diodes are connected in parallel for the RF feed, to halve the high impedance of the varactor diodes at 63.6 MHz RF for presentation at the RF port. The diodes are connected in series for the microwave port to double the very low impedance of the varactor diodes at 2.442 GHz for presentation at the microwave port. The series/parallel configuration lends itself to single ended RF drive, balanced microwave drive and two port operation. A single ended RF drive is appropriate at 63.6 MHz and is effected by means of drive through the RF input choke 23 and ground return 33 at the microwave port voltage node. A balanced microwave port is appropriate at 2.44 GHz for connection to a dipole antenna.

The microwave port operates fully balanced for LO "pump" feed at 2.442 GHz as well as for the output frequencies at 2.442 GHz±63.6 MHz. This obviates the need for any low impedance grounding in the microwave port circuits. Operation of the microwave port, fully balanced suits perfectly connection to the balanced dipole antenna 28, 29 for reception of the LO signal 7 and re-radiation of the LSB and USB signals 8.

The design of this implementation is configured to allow high, in fact potentially infinite, "4-frequency" gain. This is a re-generative condition whereby RF frequency power that is produced in the generation of the LSB signal cancels with incident RF from the signal source to result in a reduced level of absorbed RF power for a given output and hence an increased gain. The correct power balance to achieve a controlled fixed gain is dependent on the precise tuning of the microwave port 34, which in turn is dependent on the bias voltage applied to the varactor diodes 24, 25, so uses a system for precise control of the bias voltage to achieve this control, and in addition to compensate for the dependence of the microwave port tuning on LO drive level The parametric amplifiers in a wireless coils MRI scanner receive their upconversion local oscillator from their connected microwave antenna, which is exposed to a microwave field, created by an array of transmitting antennas that line the MRI scanner bore. It is desirable to provide a design of parametric amplifier that is completely powered by the incident RF field in a reliable fashion. When there is no local oscillator signal 7 present, the capacitance of the varactors 24, 25 is high because the DC bias voltage 22 is zero at this time. The resonant circuit at the output of the parametric amplifier is therefore tuned to a frequency significantly lower than the nominal tuned frequency of the parametric amplifier output. Since the output 34 of the parametric amplifier 35 is nominally tuned to the frequency of the local oscillator, when the local oscillator is not present, the resonant circuit at the output of the parametric amplifier is tuned below the local oscillator frequency. For a parallel resonant output circuit, this means that the parametric amplifier output 34 presents a low impedance to the local oscillator. When the local oscillator signal 7 is activated, this low impedance loads the signal and reduces the available local oscillator signal voltage. This reduction also affects the available varactor bias voltage 22 that is obtained by rectification of the local oscillator signal. Thus, the parametric amplifier 35 can be locked into a stable state of low bias voltage 22 that is non-functional.

Figure 3:
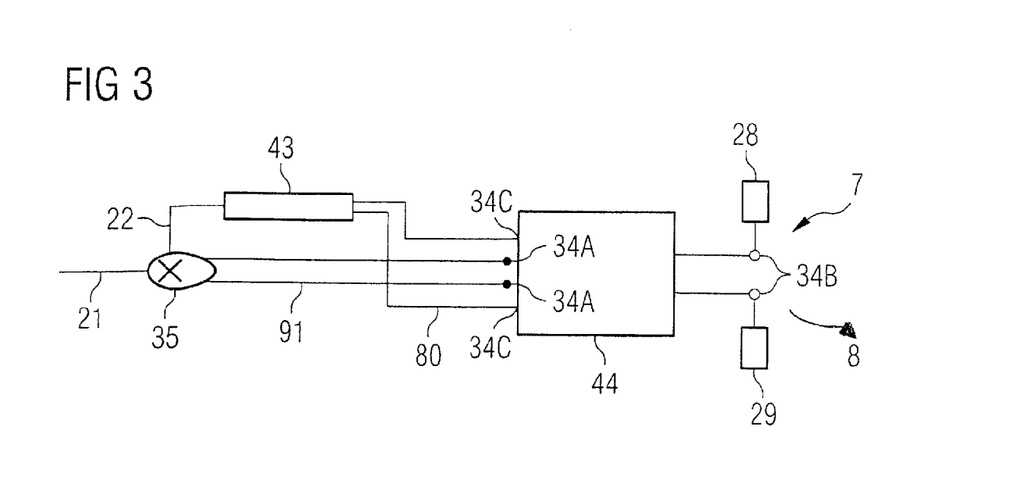
FIG. 3 is a block diagram of an upconverter according to the present invention, incorporating a parametric amplifier according to Fig.

Although this problem can be overcome by incorporating additional circuitry that detects the above condition and generates a temporary modification of the bias voltage 22, or of the reactance in the resonant circuit to 'kick' the parametric amplifier into operation, i.e. using a 'self start' circuit, this solution has its own disadvantages. It is complex and needs to be highly tailored to the circuit design. By contrast, the present invention solves the problem of the parametric amplifier being locked into a non-functional stable state by inserting a power splitter 44, such as a Wilkinson coupler, or directional coupler, between the antenna 28, 29 and the parametric amplifier 35. A schematic of a parametric amplifier device is shown in FIG. 3. A first, lower attenuation, port 34A of the power splitter 44 is connected to the second, microwave, port 34 of the parametric amplifier. A second, higher attenuation, port 34C of the coupler 44 connects to a power harvester 43, otherwise referred to as a rectifier, which generates the parametric amplifier DC bias. Port 34B connects to the antenna 28, 29. A typical ratio of attenuation is 7 dB, but other ratios are possible according to the relative power requirements of the parametric amplifier and the power harvester. This type of splitter has the benefit of isolating the changes in impedance with local oscillator strength at the parametric amplifier interface, from the source impedance of the rectifier 43. The invention solves the problem of parametric amplifier start up and removes the requirement for a self start circuit.

An RF input signal 21 from a local coil is input to the parametric amplifier core 35 and a DC bias 22, applied to the parametric amplifier 35, is supplied via the power harvester 43. The local oscillator signal 7 is received at the microwave antenna 28, 29 and applied to port 34B of the power splitter. The power splitter divides the signal and at output port 34C, one part 80 of the incident microwave signal 7 is coupled to the power harvester 43; at output port 34A, the other part 91 is coupled to the microwave port 34 of the parametric amplifier.

The power splitter 44 has different coupling levels for the different signal paths. For example, a 6 dB coupler can couple −6 dB relative power into the power harvester and −1 dB relative power into the parametric amplifier core. The directional coupler effectively isolates the power harvester from the parametric amplifier core. In particular it isolates the impedance at the output of the parametric amplifier core from the impedance seen by the power harvester.

As can be seen from FIG. 3, the splitter 44 is connected between the antennas 28, 29 and the parametric amplifier 35. Most of the incident power goes to the parametric amplifier 35. A smaller part is diverted to the rectifier 43 which converts it into a DC signal by rectification, to provide a bias voltage for the parametric amplifier 35. The splitter 44 presents a minimum loss to signals coming back out to the antenna from the parametric amplifier 35. The return signal does not go out to the rectifier 43, as the splitter provides isolation to prevent this.

Figure 4:
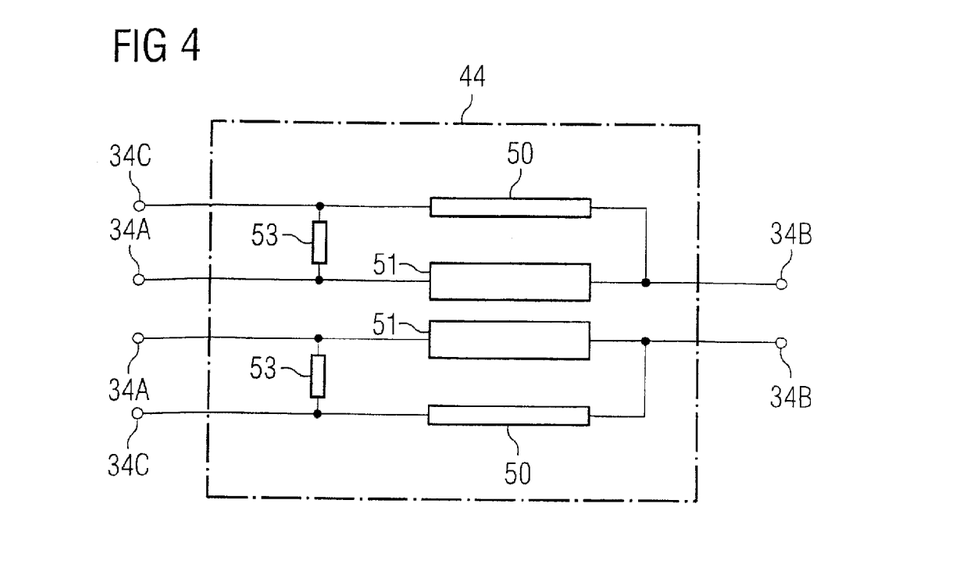
FIG. 4 shows an example of a power splitter in more detail, for use in the upconverter of FIG. 3.
Figure 5A:
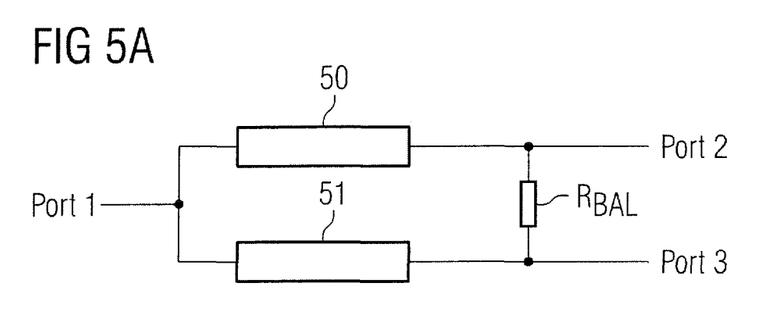
FIG. 5A illustrates a symmetric power splitter.
Figure 5B:
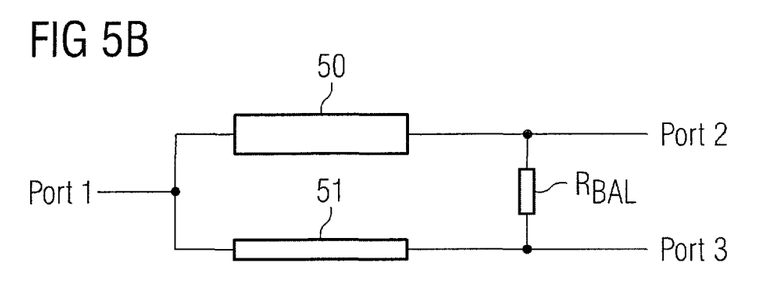
FIG. 5B illustrates an asymmetric power splitter.

Different types of power splitter 44 may be used. FIG. 4 illustrates a pair of asymmetric Wilkinson splitters, each with two ¼ wavelength tracks 50, 51 of two different widths and a balancing resistor 53. The impedance of the track 51 is lower than that of the track 50, so allowing most of the incident power to be directed to the parametric amplifier 35. FIGS. 5A and 5B show simplified forms illustrating the operation of the power splitter. FIG. 5A illustrates a Wilkinson splitter. P1 sees an impedance of 50Ω. The signal splits equally through quarter wavelength lines 50, 51 at an impedance of approximately 72Ω. A balancing resistor at 100Ω is connected between P2 and P3. This arrangement gives a perfect match P1, if and only if, P2 and P3 are terminated in 50Ω. The arrangement presents a perfect match at P2 and P3, if and only if, P1 is terminated. The power incident on P1 is divided to give −3 dB at P2 and P3. FIG. 4 illustrates a pair of asymmetric Wilkinson splitters, each having two ¼ wavelength tracks of different width. Port P1 is equivalent to the microwave port 34 and ports P2 and P3 are connections to the parametric amplifier 35 and rectifier 43 respectively.

Usually, power is split equally between P2 and P3, but the requirements of the present invention are for an asymmetric structure, such as shown in FIGS. 4 and 5B, giving rise to only a small part of the power going to the power harvester 43 and most of the power going to the parametric amplifier 35. A preferred split is of approximately −7 dB to 0 dB, power harvester to amplifier. This can be achieved using impedances of 30Ω/110Ω with 2 mm/0.5 mm wide tracks and a balancing resistor of around 180Ω.

Figure 6A:
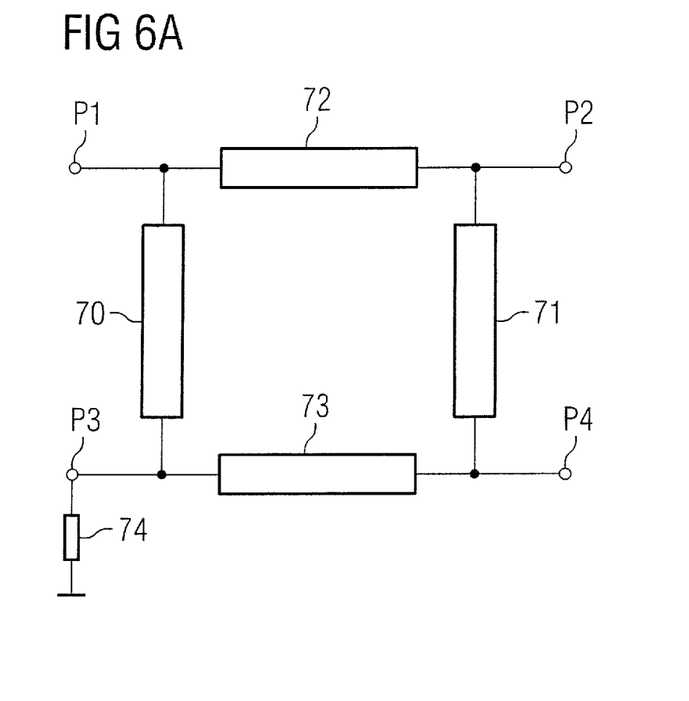
FIG. 6A illustrates a quadrature hybrid branch line splitter.
Figure 6B:
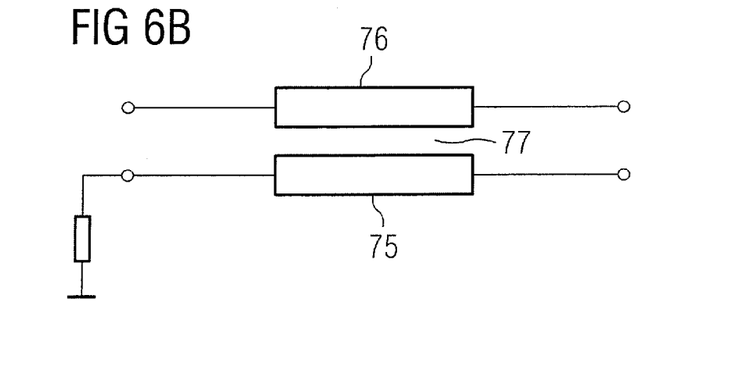
FIG. 6B illustrates an edge coupler.

Other types of splitter include directional couplers, for example, either branch line or edge couplers. The branch line coupler of FIG. 6A is a quadrature hybrid, where pairs 70, 71; 72, 73 of the same impedance are arranged to get power in at P1, dividing between P2 and P4, but with nothing out at P3, which is connected to ground. These are more difficult to manufacture than Wilkinson coupler's and as P3 is surplus to requirements, the couplers are also less compact. The edge coupler of FIG. 6B is made by printing two tracks 75, 76 very close together. This has 4 ports and one is connected to earth via a dump resistor. The required gap 77 between the tracks would be too small for existing manufacturing tolerances, as the ratio of track width to thickness of the dielectric determines the necessary spacing.

Figure 7:
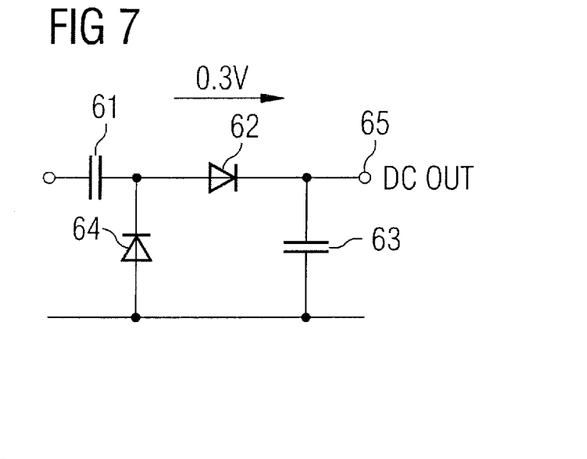
FIG. 7 illustrates a simple rectifier circuit for use as a power harvester in the device of FIG. 3.

The power harvester 43 may incorporate a resonant voltage transformation circuit and/or a Cockcroft-Walton voltage multiplier as necessary to obtain the required output voltage. FIG. 7 illustrates operation of an embodiment of a power harvester circuit suitable for the upconverter of the present invention. An input signal 60 sees a low impedance at RF frequency (e.g. 2.4 GHz) in capacitor 61, which may be a 100 pF capacitor, but this capacitor provides a block at DC. When the voltage goes high, diode 62 starts to conduct, takes current and puts charge onto the upper plate of the other capacitor 63. When the voltage goes low, the first diode 62 is reverse bias and the other diode 64 is forward biased. This restores charge to the first capacitor 61. Over time, the effect is to produce a DC output at 65.

Figure 8:
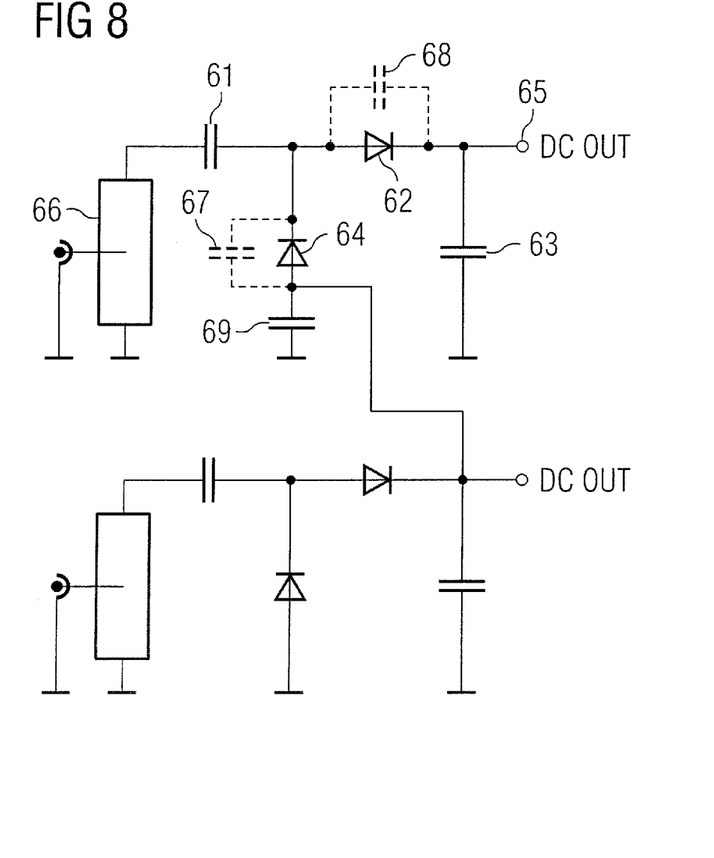
FIG. 8 shows an alternative example of a rectifier circuit for use as a power harvester in the device of FIG. 3.

An alternative implementation is shown in the example of FIG. 8, using a pair of rectifier circuits with a ¼ wavelength line 66. By tapping into the line 66 low down, the line resonates to increase the amplitude of the signal coming out to capacitor 61. Due to parasitic capacitances 67, 68 of the diodes 64, 62, the required line is actually less than ¼ wavelength. The rectifier is tuned to 2.44 GHz and the available voltage is further increased by adding two outputs 65 together, using another capacitor 69 in the middle line, effectively acting as new ground, to get twice the voltage out at the same current.

Although modifications and changes may be suggested by those skilled in the art, it is the intention of the inventor to embody within the patent warranted hereon all changes and modifications as reasonably and properly come within the scope of his or her contribution to the art.

I claim as my invention:

1. An upconverter comprising:
    a two port parametric amplifier, the amplifier comprising a first port to receive an input signal to be amplified and upconverted and a second port to receive a local oscillator signal and to output the amplified, upconverted signal at upper and lower sideband frequencies;
    an antenna coupled to the second port; and
    a power splitter connected between the second port of the parametric amplifier and the antenna.

2. An upconverter according to claim 1, wherein the local oscillator signal has a frequency at least twice that of the input signal.

3. An upconverter according to claim 1, further comprising a power harvester inserted between an output of the power splitter and a DC bias input of the parametric amplifier.

4. An upconverter according to claim 3, wherein the power harvester includes a Cockcroft Walton multiplier.

5. An upconverter according to claim 3, wherein the power harvester includes an impedance circuit to increase the available RF voltage from the local oscillator prior to rectification to DC.

6. An upconverter according to claim 3, wherein the output of the power splitter, connected to the power harvester has a higher attenuation than an output of the power splitter connected to the parametric amplifier.

7. An upconverter according to claim 1, wherein the power splitter comprises one of a directional coupler and a Wilkinson coupler.

8. An upconverter according to claim 1, wherein the two port parametric amplifier comprises a pair of varactor diodes connected between the first port and the second port; wherein the diodes are connected in parallel from the first port and in series from the second port.

9. An upconverter according to claim 1, wherein the first port is an RF port.

10. An upconverter according to claim 9, wherein the first port receives signals in the frequency range 20 MHz to 500 MHz.

11. An upconverter according to claim 1, wherein the second port is a microwave port.

12. An upconverter according to claim 11, wherein the second port receives signals in the frequency range 1 GHz to 5 GHz.

13. A wireless magnetic resonance imaging system comprising:
    a local oscillator and transceiver array mounted on or downstream of a bore of the system;
    a wireless local coil array and upconversion stage comprising a plurality of upconverters; and
    each of said upconverters comprising a two port parametric amplifier, the amplifier comprising a first port to receive an input signal to be amplified and upconverted and a second port to receive a local oscillator signal and to output the amplified, upconverted signal at upper and lower sideband frequencies, an antenna coupled to the second port, and a power splitter connected between the second port of the parametric amplifier and the antenna.

* * * * *